(12) United States Patent
Sammoura et al.

(10) Patent No.: US 8,616,056 B2
(45) Date of Patent: Dec. 31, 2013

(54) BAW GYROSCOPE WITH BOTTOM ELECTRODE

(75) Inventors: Firas N. Sammoura, Melrose, MA (US); Kuang L. Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 272 days.

(21) Appl. No.: 12/983,476

(22) Filed: Jan. 3, 2011

(65) Prior Publication Data

US 2012/0111113 A1    May 10, 2012

Related U.S. Application Data

(63) Continuation-in-part of application No. 12/940,354, filed on Nov. 5, 2010.

(51) Int. Cl.
*G01C 19/56* (2012.01)

(52) U.S. Cl.
USPC ...................................... 73/504.13

(58) Field of Classification Search
USPC ............... 73/504.01, 504.02, 504.12, 504.13
See application file for complete search history.

(56) References Cited

U.S. PATENT DOCUMENTS

| | | | |
|---|---|---|---|
| 4,655,081 A | 4/1987 | Burdess | 73/505 |
| 4,809,589 A | 3/1989 | Bertrand | 92/98 R |
| 5,177,579 A | 1/1993 | Jerman | 73/724 |
| 5,383,362 A | 1/1995 | Putty et al. | 73/505 |
| 5,450,751 A * | 9/1995 | Putty et al. | 73/504.18 |
| 5,589,082 A | 12/1996 | Lin et al. | 216/2 |
| 5,616,864 A | 4/1997 | Johnson et al. | 73/504.04 |
| 5,750,899 A | 5/1998 | Hegner et al. | 73/756 |
| 5,767,405 A | 6/1998 | Bernstein et al. | 73/504.16 |
| 5,783,749 A * | 7/1998 | Lee et al. | 73/504.12 |
| 5,937,275 A | 8/1999 | Munzel et al. | 438/50 |
| 5,992,233 A | 11/1999 | Clark | 73/514.35 |
| 6,151,964 A | 11/2000 | Nakajima | 73/504.13 |
| 6,209,393 B1 | 4/2001 | Tomikawa et al. | 73/504.12 |
| 6,240,781 B1 | 6/2001 | Namerikawa | 73/504.13 |
| 6,401,534 B1 * | 6/2002 | Fell et al. | 73/504.13 |

(Continued)

FOREIGN PATENT DOCUMENTS

| | | |
|---|---|---|
| EP | 0860685 | 8/1998 |
| EP | 1788385 | 5/2007 |

(Continued)

OTHER PUBLICATIONS

Ayazi, "Intergrated Solutions for Motion Sensing in Handheld Devices," Qualtré Inc., http://www.qualtre.com/motion-sensing-technology/, Oct. 2010, 3 pages.

(Continued)

*Primary Examiner* — Helen Kwok
(74) *Attorney, Agent, or Firm* — Sunstein Kann Murphy & Timbers LLP

(57) ABSTRACT

A bulk acoustic wave gyroscope has a primary member in a member plane, and an electrode layer in an electrode plane spaced from the member plane. The electrode layer has a first portion that is electrically isolated from a second portion. The first portion, however, is mechanically coupled with the second portion and faces the primary member (e.g., to actuate or sense movement of the primary member). For support, the second portion of the electrode is directly coupled with structure in the member plane.

15 Claims, 6 Drawing Sheets

(56) References Cited

U.S. PATENT DOCUMENTS

| | | | |
|---|---|---|---|
| 6,438,242 B1 | 8/2002 | Howarth | 381/190 |
| 6,635,509 B1 | 10/2003 | Ouellet | 438/106 |
| 6,848,305 B2* | 2/2005 | Fell et al. | 73/504.13 |
| 6,877,374 B2 | 4/2005 | Geen | 73/504.14 |
| 6,892,575 B2 | 5/2005 | Nasiri et al. | 73/504.12 |
| 6,958,566 B2 | 10/2005 | Nguyen et al. | 310/321 |
| 6,985,051 B2 | 1/2006 | Nguyen et al. | 333/186 |
| 7,032,451 B2 | 4/2006 | Geen | 73/504.14 |
| 7,043,985 B2 | 5/2006 | Ayazi et al. | 73/504.04 |
| 7,051,590 B1 | 5/2006 | Lemkin et al. | 73/504.04 |
| 7,089,792 B2 | 8/2006 | Geen | 73/504.14 |
| 7,178,378 B2 | 2/2007 | Crawley et al. | 73/24.06 |
| 7,204,144 B2 | 4/2007 | Geen | 73/504.14 |
| 7,216,539 B2 | 5/2007 | Geen | 73/504.14 |
| 7,357,025 B2 | 4/2008 | Geen | 73/504.12 |
| 7,420,318 B1 | 9/2008 | Pulskamp | 310/328 |
| 7,427,819 B2 | 9/2008 | Hoen et al. | 310/320 |
| 7,492,241 B2 | 2/2009 | Piazza et al. | 333/189 |
| 7,543,496 B2* | 6/2009 | Ayazi et al. | 73/504.12 |
| 7,551,043 B2 | 6/2009 | Nguyen et al. | 333/186 |
| 7,581,443 B2 | 9/2009 | Kubena et al. | 73/504.12 |
| 7,637,156 B2 | 12/2009 | Araki et al. | 73/504.13 |
| 7,874,209 B2 | 1/2011 | Stewart | 73/504.01 |
| 7,895,892 B2 | 3/2011 | Aigner | 73/504.01 |
| 8,056,413 B2 | 11/2011 | Yazdi | 73/504.13 |
| 8,166,816 B2* | 5/2012 | Ayazi et al. | 73/504.12 |
| 2003/0119220 A1 | 6/2003 | Mlcak et al. | 438/52 |
| 2003/0183888 A1 | 10/2003 | Bar-Sadeh et al. | 257/419 |
| 2004/0051595 A1 | 3/2004 | Yoshimine et al. | 331/158 |
| 2004/0085000 A1 | 5/2004 | Ogiura | 310/329 |
| 2005/0072230 A1 | 4/2005 | Koike et al. | 73/504.12 |
| 2005/0148065 A1 | 7/2005 | Zhang et al. | 435/287.2 |
| 2006/0133953 A1 | 6/2006 | Zhang et al. | 422/58 |
| 2006/0196253 A1 | 9/2006 | Crawley et al. | 73/53.01 |
| 2006/0197411 A1 | 9/2006 | Hoen et al. | 310/320 |
| 2006/0237806 A1 | 10/2006 | Martin et al. | 257/415 |
| 2006/0238078 A1 | 10/2006 | Liu | 310/338 |
| 2007/0046398 A1 | 3/2007 | Nguyen et al. | 333/186 |
| 2007/0172940 A9 | 7/2007 | Manalis et al. | 435/287.2 |
| 2007/0220971 A1 | 9/2007 | Ayazi et al. | 73/504.02 |
| 2007/0256495 A1 | 11/2007 | Watson | 73/504.12 |
| 2007/0284971 A1 | 12/2007 | Sano et al. | 310/364 |
| 2008/0054759 A1* | 3/2008 | Ayazi et al. | 310/309 |
| 2008/0190181 A1 | 8/2008 | Khuri-Yakub et al. | 73/64.53 |
| 2008/0282833 A1 | 11/2008 | Chaumet | 74/5 R |
| 2009/0095079 A1 | 4/2009 | Ayazi | 73/514.29 |
| 2009/0114016 A1 | 5/2009 | Nasiri et al. | 73/504.12 |
| 2009/0173157 A1 | 7/2009 | Stewart | 73/504.13 |
| 2009/0173158 A1 | 7/2009 | Gehring | 73/590 |
| 2009/0188317 A1 | 7/2009 | Aigner | 73/504.01 |
| 2009/0266162 A1 | 10/2009 | Ayazi et al. | 73/504.12 |
| 2009/0277271 A1 | 11/2009 | Seppa et al. | 73/627 |
| 2010/0058861 A1 | 3/2010 | Kuang et al. | 73/504.12 |
| 2010/0148341 A1 | 6/2010 | Fuji et al. | 257/686 |
| 2010/0263445 A1 | 10/2010 | Hayner et al. | 73/504.12 |
| 2010/0294039 A1 | 11/2010 | Geen | 73/504.12 |
| 2011/0192226 A1 | 8/2011 | Hayner et al. | 73/504.12 |
| 2011/0254599 A1 | 10/2011 | Dikshit et al. | 327/156 |
| 2012/0013744 A1 | 1/2012 | Kim et al. | 348/246 |
| 2012/0111112 A1 | 5/2012 | Sammoura et al. | 73/514.01 |
| 2012/0111113 A1 | 5/2012 | Sammoura et al. | 73/514.01 |
| 2012/0112765 A1 | 5/2012 | Sparks et al. | 324/633 |
| 2012/0137773 A1* | 6/2012 | Judy et al. | 73/504.12 |
| 2012/0137774 A1* | 6/2012 | Judy et al. | 73/504.12 |
| 2012/0195797 A1 | 8/2012 | Sparks et al. | 422/69 |
| 2012/0227487 A1* | 9/2012 | Ayazi et al. | 73/504.08 |

FOREIGN PATENT DOCUMENTS

| | | |
|---|---|---|
| EP | 2 078 925 | 7/2009 |
| EP | 2216904 | 8/2010 |
| JP | 9116250 | 5/1997 |
| JP | 2004 301734 | 10/2004 |
| WO | WO 2007/061610 | 5/2007 |
| WO | WO 2009/066640 | 5/2009 |

OTHER PUBLICATIONS

Ayazi et al., "High Aspect-Ratio Combined Poly and Single-Crystal Silicon (HARPSS) MEMS Technology;" Journal of Microelectromechanical Systems, vol. 9, No. 3, Sep. 2000.

Ayazi et al., "Design and Fabrication of a High-Performance Polysilicon Vibrating Ring Gyroscope;" Center for Integrated Sensors and Circuits; Eleventh IEEE/ASME International Workshop on Micro Electro Mechanical Systems, Heidelberg, Germany, Jan. 25-29, 1998.

Ayazi et al., "A HARPSS Polysilicon Vibrating Ring Gyroscope;" Journal of Microelectromechanical Systems, vol. 10, No. 2, Jun. 2001.

Benes et al., "Comparison Between BAW and SAW Sensor Principles," *IEEE Transactions on Ultrasonics, Ferroelectrics and Frequency Control*, vol. 45 No. 5, Sep. 1998, pp. 1314-1330, 17 pages.

Bernstein, "An Overview of MEMS Inertial Sensing Technology," *Sensors*, http://www.sensorsmag.com/sensors/acceleration-vibration/an-overview-mems-inertial-sensing-technology-970 , Feb. 1, 2003, 6 pages.

Celikel et al., "Optoelectronic Design Parameters of Interferometric Fiber Optic Gyroscope with LiNbO3 Having North Finder Capability and Earth Rotation Rate Measurement," *Indian Journal of Pure & Applied Physics*, vol. 48, pp. 375-384, Jun. 2010, 10 pages.

Doe, "Qualtré Targets 3-Axis Gyro Market with Alternative Technology," *MEMS Trends*, Issue No. 3, pp. 8, Jul. 2010, 1 page.

Drafts, "Acoustic Wave Technology Sensors," Sensors (www.sensorsmag.com), 5 pages, Oct. 1, 2000.

Dubois, "Thin film bulk acoustic wave resonators: a technology overview," MEMSWAVE 03, Toulouse, France, 4 pages, Jul. 2-4, 2003.

Geen et al., New iMEMS® Angular- Rate-Sensing Gyroscope; ADI Micromachined Products Division; Analog Dialogue 37-7 (2003).

Johari, "Micromachined Capacitive Silicon Bulk Acoustic Wave Gyroscopes," A Dissertation Presented to the Academic Faculty in Partial Fulfillment of the Requirements for the Degree Doctor of Philosophy in the School of Mechanical Engineering Georgia Institute of Technology, Dec. 2008, 28 pages.

Johari et al., "High-Frequency Capacitive Disk Gyroscope in (100) and (111) Silicon," School of Electrical and Computer Engineering, Georgia Institute of Technology, MEMS 2007, pp. 47-50, Jan. 2007, 4 pages.

Johari et al., "Capacitive Bulk Wave Silicon Disk Gyroscopes," Electron Devices Meeting, 2006, Dec. 1, 2006, 4 pages.

Johnson, "Qualtre Preps Solid State MEMS Gyros," *MEMS Investor Journal*, http://www.memsinvestorjournal.com/2010/04/qualtre-preps-solidstate-mems-gyros.html_, Apr. 8, 2010, 2 pages.

Link, "Angular Rate Detector DAVED®-RR," Application Report SE 090.2; Institute of Micromachining and Information Technology, 1 page, Dec. 11, 2007, http://hsgimit.de/fileadmin/gfx/pdfs/AnwendungsberichtSE090_2rr_englisch_V1.pdf.

Link, "Angular Rate Detector DAVED®-LL," Application Report SE 100.1; Institute of Micromachining and Information Technology, 1 page, Dec. 11, 2007, hsg-imit.de/fileadmin/gfx/pdfs/anwendungsberichtse100_111_englisch01.pdf.

Nasiri, "A Critical Review of MEMS Gyroscopes Technology and Commercialization Status," InvenSense, 8 pages, 2005, www.scantec.de/uploads/media/MEMSGyroComp_02.pdf.

Ramirez, "PZE Energy Harvester," *45 RF MEMS Based Circuit Design*—conocimeintos.com.ve, http://conocimientosrfmemsdesign.blogspot.com/2010/07/pze-energy-harvester.html , Jul. 24, 2010, 4 pages.

Satrom et al., "Disc Resonating Gyroscopes: A Summary of a Recent Development in MEMS Technology," Northwestern University, http://www.google.com/url?sa=t&rct=j&q=&esrc=s&frm=1 &source=web&cd=1&sqi=2&ved=0CCQQFjAA &url=http%3A%2F%2Fclifton.mech.northwestern. edu%2F~me381%2Fproject%2F06fall%2FFruthSatrom.pdf &ei=ZOsyT6D3IMjMrQfE6qSnDA

(56) References Cited

OTHER PUBLICATIONS

&usg=AFQjCNFXOj00sAsF6bMdfEV70D7JzzLkBw &sig2=jwpU1Tgot45sT_fgi81zMw, Dec. 1, 2006, 15 pages.
Saukoski, "System and Circuit Design for a Capacitive MEMS Gyroscope," Doctoral Dissertation, TKK Dissertations 116, Helsinki University of Technology, 279 pages (2008).
Yang et al., "An electro-thermal bimorph-based microactuator for precise track-positioning of optical disk drives;" J. Micromech. Microeng., v. 15 (2005) 958-965 Journal of Micromechanics and Microengineering.
Jonathan Grant, Third Party Submission under 37 C.F.R. § 1.290 for U.S. Appl. No. 12/983,476, 8 pages, dated Nov. 6, 2012.
Jonathan Grant, Third Party Submission under 37 C.F.R. § 1.290 for U.S. Appl. No. 13/308,687, 8 pages, dated Nov. 6, 2012.
International Searching Authority, International Search Report and Written Opinion—International Application No. PCT/US2009/056456, Feb. 16, 2010, 18 pages.
International Searching Authority, International Search Report and Written Opinion—International Application No. PCT/US2010/044994, dated Nov. 3, 2010, 11 pages.
International Searching Authority, Invitation to Pay Additional Fees and, Where Applicable, Protest Fee; European Patent Office, International Application No. PCT/US2011/062966, 6 pages, dated Feb. 3, 2012.
International Searching Authority, International Search Report and Written Opinion, International Application No. PCT/US2011/062966, Apr. 12, 2012, 15 pages.
International Searching Authority, Invitation to Pay Additional Fees and, Where Applicable, Protest Fee, International Application No. PCT/US2011/062961, May 8, 2012, 8 pages.
International Searching Authority, International Search Report and Written Opinion, International Application No. PCT/US2011/058908, Apr. 12, 2012, 12 pages.

\* cited by examiner

US 8,616,056 B2

BAW GYROSCOPE WITH BOTTOM ELECTRODE

PRIORITY

This patent application is a continuation-in-part of U.S. patent application Ser. No. 12/940,354, filed Nov. 5, 2010, and entitled, "RESONATING SENSOR WITH MECHANICAL CONSTRAINTS," the disclosure of which is incorporated herein, in its entirety, by reference.

TECHNICAL FIELD

The invention generally relates to bulk acoustic wave sensors and, more particularly, the invention relates to electrodes in bulk acoustic wave sensors.

BACKGROUND ART

Bulk acoustic wave ("BAW") gyroscope use has increased in recent years. This trend is driven by their many benefits including, among other things, their high gain factor, which causes them to use less power than conventional gyroscopes. In addition, such gyroscopes generally cost less to manufacture.

To those ends, many bulk acoustic wave gyroscopes known to the inventors have a disk with a crystal lattice that, during either or both an actuation or detection phase, vibrates/resonates at a very high frequency, typically in the megahertz range. This is in contrast to gyroscopes having a disk mechanically moving back and forth about a substrate in both phases. When the crystal lattice of the disk vibrates, the disk is considered to be operating in a "bulk" mode.

SUMMARY OF THE INVENTION

In accordance with one embodiment of the invention, a bulk acoustic wave gyroscope has a primary member in a member plane, and an electrode layer in an electrode plane spaced from the member plane. The electrode layer has a first portion that is electrically isolated from a second portion. The first portion, however, is mechanically coupled with the second portion and faces the primary member (e.g., to actuate or sense movement of the primary member). For support, the second portion of the electrode is directly coupled with structure in the member plane.

The gyroscope may have conductive path extending from structure in the member plane and into the second portion of the electrode layer. Among other things, the conductive path may include a via. Alternatively or in addition, an oxide may directly couple the second portion of the electrode layer with the structure in the member plane.

The second portion of the electrode layer may be grounded, while the first portion may hold a potential. In some embodiments, to isolate the two portions of the electrode layer, a trench separates the first portion of the electrode layer from the second portion of the electrode layer. This trench may be at least partly filled with a dielectric material to provide the electrical isolation and yet mechanically connect the portions. Moreover, the gyroscope may have a side electrode, in the member plane, that is radially spaced from the primary member.

A number of materials may form the layers. For example, the primary member and electrode layer may be formed at least in part from a silicon-on-insulator wafer. Moreover, in certain embodiments, the primary member forms a disk that resonates in a flexure mode response to receipt of an electrostatic signal from the first portion of the electrode layer.

In accordance with another embodiment of the invention, a bulk acoustic wave gyroscope has a resonating member in a member plane, and an electrode layer in an electrode plane. The member and electrode planes are spaced apart, and the resonating member is formed at least in part from a first layer of a silicon on insulator wafer. In a similar manner, the bottom electrode layer is formed at least in part from a second layer of the same silicon on insulator wafer. The bottom electrode layer has a first portion and a second portion, where the first portion is electrically isolated from, and mechanically secured to, the second portion. The first portion faces the resonating member and is configured to electrostatically actuate the resonating member when subjected to a resonating voltage. The second portion of the electrode layer is anchored to structure in the member plane.

In accordance with other embodiments of the invention, a method of forming a bulk acoustic wave gyroscope forms a primary member in a member plane, forms an electrode layer in an electrode plane that is longitudinally spaced from the member plane, and removes a portion of the electrode layer to form a trench. The method also fills the trench with a nonconductive material to produce a first portion of the electrode layer and a second portion of the electrode layer. The nonconductive material mechanically connects the first portion of the electrode layer and the second portion of the electrode layer, while electrically isolating the first portion from the second portion.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIG. 2 is rotated 180 degrees from FIG. 3, which is oriented appropriately for use of the terms "top" and "bottom."

DESCRIPTION OF ILLUSTRATIVE EMBODIMENTS

In illustrative embodiments, a bulk acoustic wave gyroscope has an electrode on a different plane than that of its resonating primary member. In addition, that electrode has first and second portions that are electrically isolated from and mechanically coupled to each other. Details of illustrative embodiments are discussed below.

Figure 1:
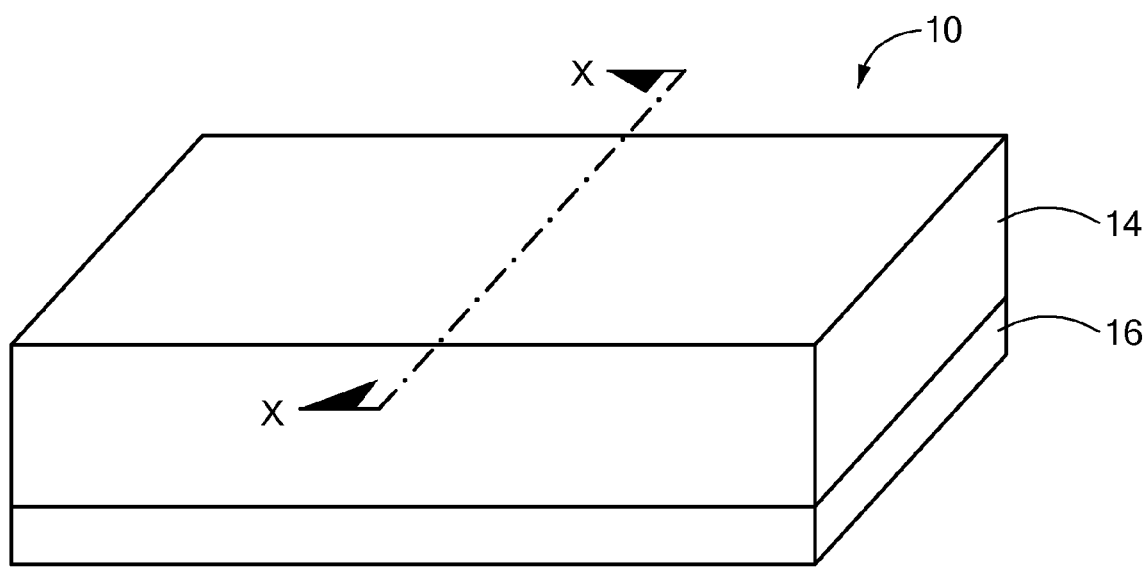
FIG. 1 schematically shows a perspective view of a packaged inertial sensor having a bulk acoustic wave gyroscope configured in accordance with illustrative embodiments of the invention.

FIG. 1 schematically shows a perspective view of a packaged inertial sensor 10 having a bulk acoustic wave gyroscope 12 (FIG. 2 and others, discussed below) configured in accordance with illustrative embodiments of the invention. This package protects its interior gyroscope 12 from the environment. As shown, the package has a top portion 14 that connects with a bottom portion 16 to form an interior (not shown) for containing the gyroscope 12. Although not necessary, some embodiments of the invention hermetically seal the package interior. Other embodiments of the package, however, do not provide a hermetic seal.

The package can be any of a variety of different types, such as, among other things, a pre-molded leadframe package, a substrate package, or a ceramic package. The top portion 14 and/or the bottom portion 16 can be planar or form a cavity. In either case, the top and bottom portions 14 and 16 should appropriately couple to protect the gyroscope 12. For example, if the top portion 14 is flat, then the bottom portion 16 should have a cavity, or there should be some spacing apparatus to form the interior with an appropriate volume for containing the gyroscope 12.

In alternative embodiments, the package is a conventional post-molded, plastic leadframe package. Specifically, as known by those skilled in the art, this relatively inexpensive package type molds plastic, in liquid form, directly around the gyroscope die 12. This packaging process therefore can damage the gyroscope 12 if it is not properly sealed. In that case, the sensitive microstructure within the gyroscope 12 preferably is hermetically sealed or otherwise protected from the molding process.

It should be noted that although this discussion and attendant figures describes specific gyroscope, other bulk gyroscope designs also may incorporate principles of various embodiments. This discussion of a specific bulk acoustic wave gyroscope therefore is for illustrative purposes only and not intended to limit all embodiments of the invention.

The packaged gyroscope 10 may be used in any number of different applications. For example, it could be part of a larger guidance system in an aircraft, or part of a satellite sensor in an automobile that cooperates with a stabilization system to maintain a smooth ride. The packaged gyroscope 10 thus has a plurality of interfaces (not shown) for communicating with exterior components.

To those ends, the packaged gyroscope 10 may have a plurality of pins (not shown) on its bottom, top, and/or side surfaces for making a mechanical and electrical connection with an underlying system, such as a printed circuit board. Alternatively, the package may have a plurality of pads (not shown) for surface mounting the package to an underlying printed circuit board. Conventional soldering techniques should suffice to make this connection. The printed circuit board may have additional components that interact with the device to both control the gyroscope die 12, and receive output signals indicating rotational acceleration of the overall system. For example, the printed circuit board also may have one or more application-specific integrated circuits (ASICs) and other circuit devices for controlling operation.

Figure 2:
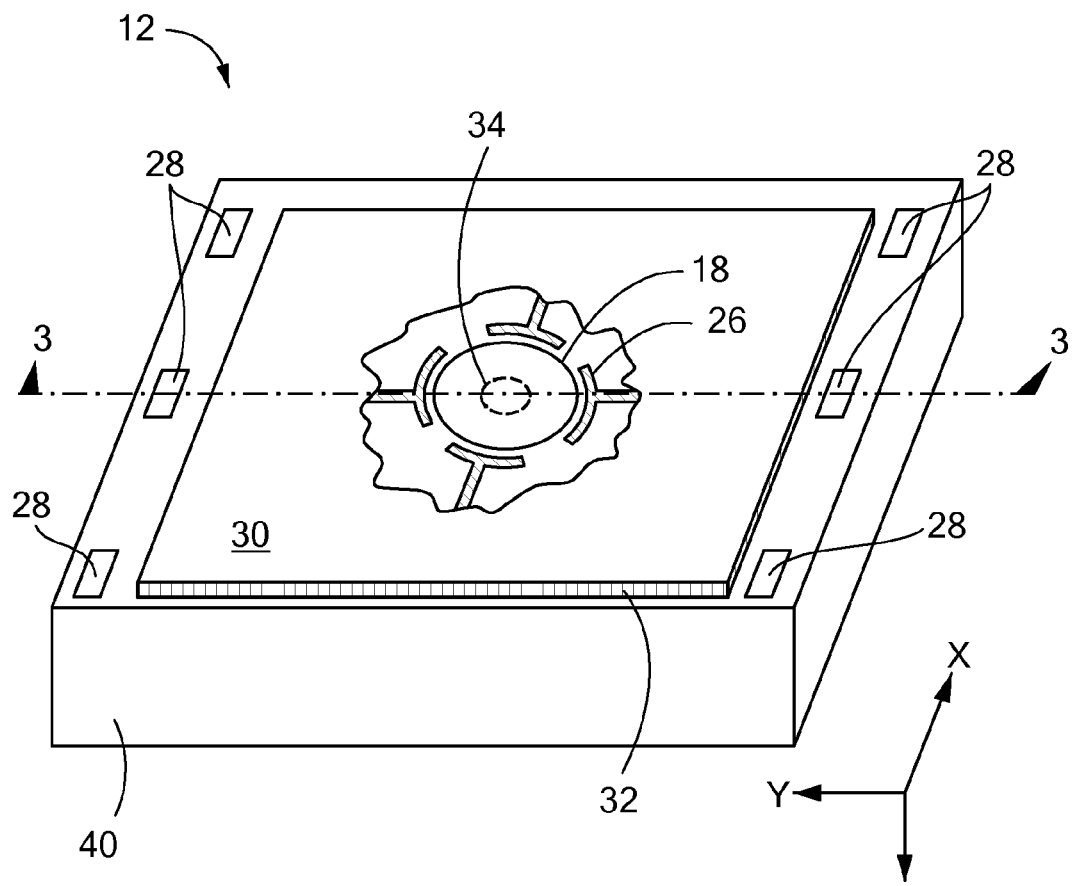
FIG. 2 schematically shows a perspective view of a bulk acoustic wave gyroscope configured in accordance with illustrative embodiments of the invention. This figure has a partial cutaway view to show the vibrating disk.
Figure 3:
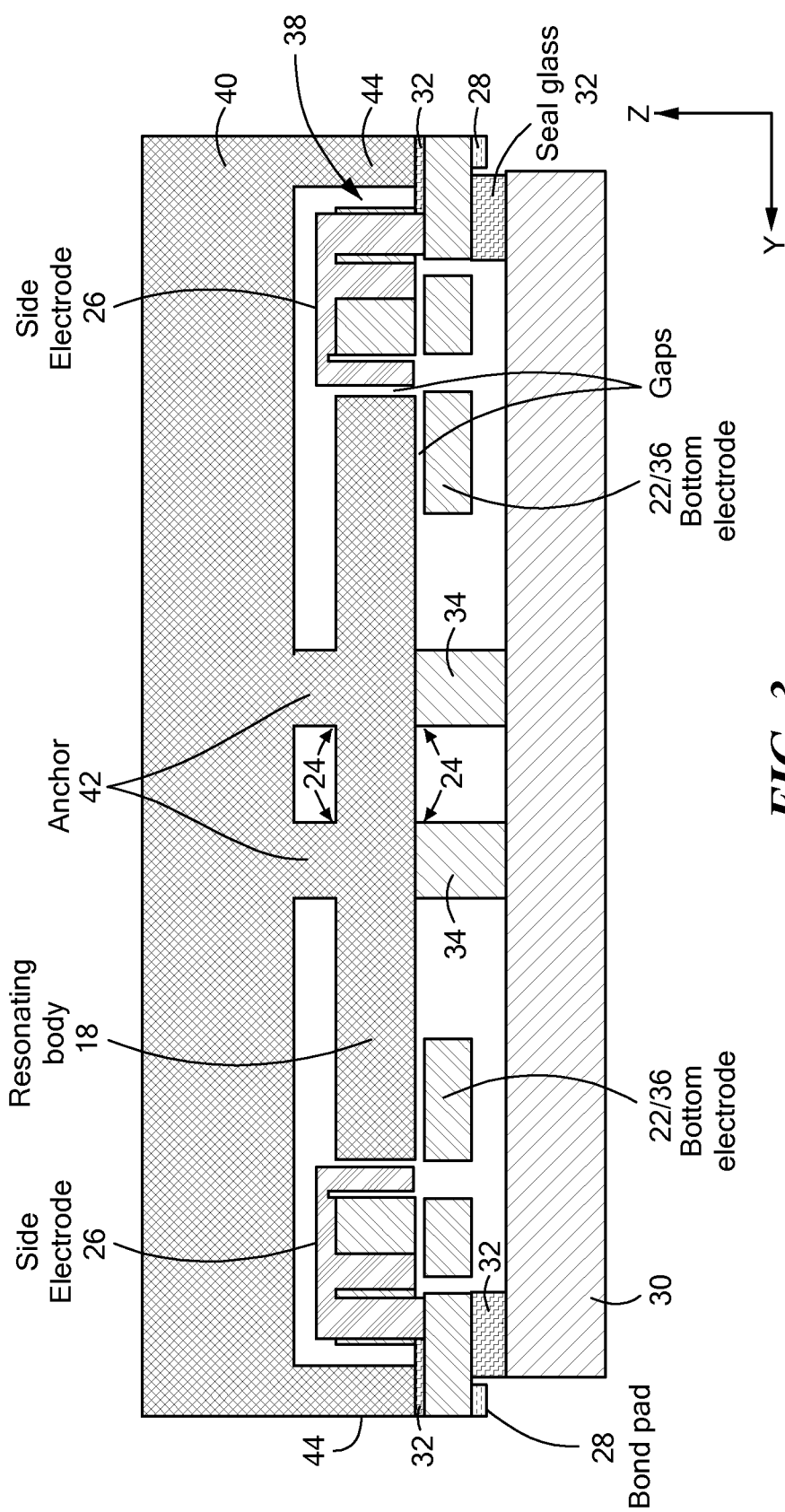
FIG. 3 schematically shows a cross-sectional view of the bulk acoustic wave gyroscope of FIG. 2 along line 3-3.

FIG. 2 schematically shows a perspective view of a bulk acoustic wave gyroscope 12 that may be configured in accordance with illustrative embodiments of the invention. This figure also has a partial cutaway view to show its vibrating disk 18, and an outline of a member stabilizing a portion of that disk 18 (shown in dashed lines). To further illustrate this embodiment, FIG. 3 schematically shows a rotated, cross-sectional view of the bulk acoustic wave gyroscope of FIG. 2 along line 3-3.

Specifically, this description uses the terms "top," "bottom," and the like for descriptive purposes only. Those terms are used with respect to the frame of reference of FIG. 3. FIG. 2, however, is rotated 180 degrees (i.e., the top is down and the bottom is up) to better show the components. Accordingly, for elements identified as "top" elements in FIG. 3, the correct orientation is on the bottom side of FIG. 2. For example, FIG. 2 shows a top substrate 40 near the top of the structure, while FIG. 3 shows that same top substrate 40 near the bottom of the structure—because FIG. 3 is rotated 180 degrees from the frame of reference figure.

This gyroscope 12 is a two dimensional gyroscope that measures rotational movement about the X-axis and Y-axis shown in FIG. 2. Accordingly, those skilled in the art refer to this type of gyroscope as an X/Y gyroscope, or a two dimensional gyroscope. It nevertheless should be reiterated that illustrative embodiments apply to gyroscopes that measure rotation about its other axes, such as the Z-axis alone, about the X-axis and Z-axis, or about all three axes, among other things. Accordingly, discussion of this specific two-dimensional bulk acoustic wave gyroscope 12 should not limit various embodiments of the invention.

At its core, the bulk acoustic wave gyroscope 12 has a generally planar disk 18 (noted above and also referred to as a "primary member") that resonates in a flexure mode upon receipt of an electrostatic actuation signal. In particular, during the flexure mode, a bottom electrode 22 (discussed below) produces an electrostatic force that causes portions of the disk 18 to vibrate in and out of the plane of the disk 18. As a bulk acoustic wave gyroscope, however, the crystal lattice of the disk 18 itself vibrates in response to both a rotation and the continued actuation by the noted electrostatic signal. This is in contrast to other types of gyroscopes that have a shuttle/mass vibrating back and forth above a substrate during both actuation and detection phases. To that end, the embodiment shown in FIGS. 2 and 3 has the above noted bottom electrode 22 for actuating/vibrating the disk 18 in a flexure mode at a preselected frequency. As known by those skilled in the art, this frequency can be quite high, such as on the order of about 1-20 Megahertz.

The disk 18 is configured to vibrate in a predetermined manner at the known vibration frequency. For example, the vibration frequency may be the resonant frequency of the disk 18 itself. As such, the disk 18 vibrates in and out of plane in a non-uniform manner. Specifically, parts of the disk 18 may vibrate, while other parts of the disk 18 may remain substantially stable; i.e., the stable portions will vibrate at approximately zero Hertz. In other words, the stable portions substantially do not vibrate at all. The stable portions are known as "nodes 24" and preferably are located generally symmetrically about the top and bottom faces of the disk 18. For example, when vibrating at the resonant frequency, the bottom face of a 200 micron radius disk 18 may have a node 24 that forms a general ellipse about the center of the disk 18. This elliptical node 24 may take on the shape of a circle with a radius of between about ten and fifteen microns.

Rotation about the X-axis or Y-axis causes the shape of the disk 18 to change. To detect this change in shape, the gyroscope 12 has a plurality of side electrodes 26 generally circumscribing the disk 18. For example, the cutaway of FIG. 2 shows four side electrodes 26 that can detect this change. More specifically, the side electrodes 26 form a variable capacitor with the side wall of the disk 18. A change in the shape of the disk 18, in the bulk mode, causes at least a portion of its side wall to change its position, thus changing the distance between it and the side electrode 26. This changes the variable capacitance measured by the side electrode 26. It is this capacitance change that provides the necessary movement information.

A plurality of pads 28 formed on the same layer as the bottom electrode 22 electrically connect the bottom and top electrodes 22 and 26 to other circuitry. Off-chip circuitry or on-chip circuitry (not shown) thus detects the noted capacitance change as a changing signal, which includes the necessary information for identifying the degree and type of rotation. The larger system then can take appropriate action, such as controlling the rotation of tires in an automobile for stabilization control, or changing the trajectory of a guided missile.

Naturally, the disk 18 should be supported to function most effectively. To that end, the gyroscope 12 has a bottom substrate 30 mechanically bonded to the bottom of the disk 18. In illustrative embodiments, the bottom substrate 30 is formed from a single crystal silicon wafer and hermetically bonded to the layer having the bottom electrode 22 and pads 28. For example, a ring of seal glass 32, or glass frit, can hermetically seal this bottom substrate 30 to the disk/electrode structure.

The bottom substrate 30 shown in FIGS. 2 and 3 also has a bottom support portion 34 that mechanically connects to the bottom face of the disk 18. In illustrative embodiments, the bottom support portion 34 is connected directly to the node 24 on the bottom face of the disk 18. As noted above, this node 24 substantially does not vibrate when the disk 18 as actuated at its resonant frequency. The bottom support portion 34 can be formed from any number of materials. For example, this structure can be a solid piece of polysilicon, or a part of the layer forming the bottom electrode 22 and seal glass 32. Alternatively, the bottom support can be formed from the same material as the bottom substrate 30—e.g., one or more pedestals formed from a timed etch of the bottom substrate 30. In that case, the bottom support is integral with the bottom substrate 30, and formed from the same material as the bottom substrate 30 (e.g., single crystal silicon).

Conventional micromachining processes may form the disk 18 and layer immediately beneath the disk 18 in any number of known ways. For example, that portion of the gyroscope 12 may be formed from a micromachined silicon-on-insulator wafer (also known as an "SOI" wafer). In that case, the disk 18 may be formed from the top, single crystal silicon layer of the SOI wafer (often referred to as the "device layer" of the SOI wafer). Moreover, the side electrodes 26 may be formed from deposited polysilicon and electrically connected with the bond pads 28, which may be formed from deposited metal.

As known by those skilled in the art, the top SOI layer is typically much thinner than the bottom, "handle," layer 36 of the SOI wafer, which also is formed from single crystal silicon. The layer having the bottom electrode 22 (referred to as the "bottom layer 36" or "electrode layer 36"), however, is thinner than the layer having the disk 18 (referred to as the "top layer 38"). Although not necessary, illustrative embodiments thin this bottom layer 36 to reduce the profile of the overall sensor, and improve the performance of the bottom electrode 22. For example, the disk 18 may have a thickness of about 50 microns, while the bottom electrode 22 may have a thickness of about 40 microns.

The gyroscope 12 also has a top substrate 40 secured to the top node region 24 of the disk. To that end, the top substrate 40 may be considered to have a top support portion 42 secured directly to the node region 24 of the top surface of the disk. In a manner similar to the bottom support portion 34, the top support portion 42 may be formed in any number of manners. For example, the top support portion(s) 42 may be formed as an anchor having a silicon-to-silicon bond with the disk 18. Moreover, the top support portion(s) 42, which, like the bottom support(s) 34, may include a number of separate members, illustratively symmetrically positioned and spaced about the top surface of the disk.

The top substrate 40 also has an annular sealing region 44 that forms a seal with the bottom layer 36 of the disk/lower electrode apparatus. In a manner similar to the bottom substrate 30, the top substrate 40 may not provide a hermetic seal. When both substrates provide a hermetic seal, however, those skilled in the art should expect the disk 18 to be fully protected by the chamber formed by both of the substrates.

Figure 4:
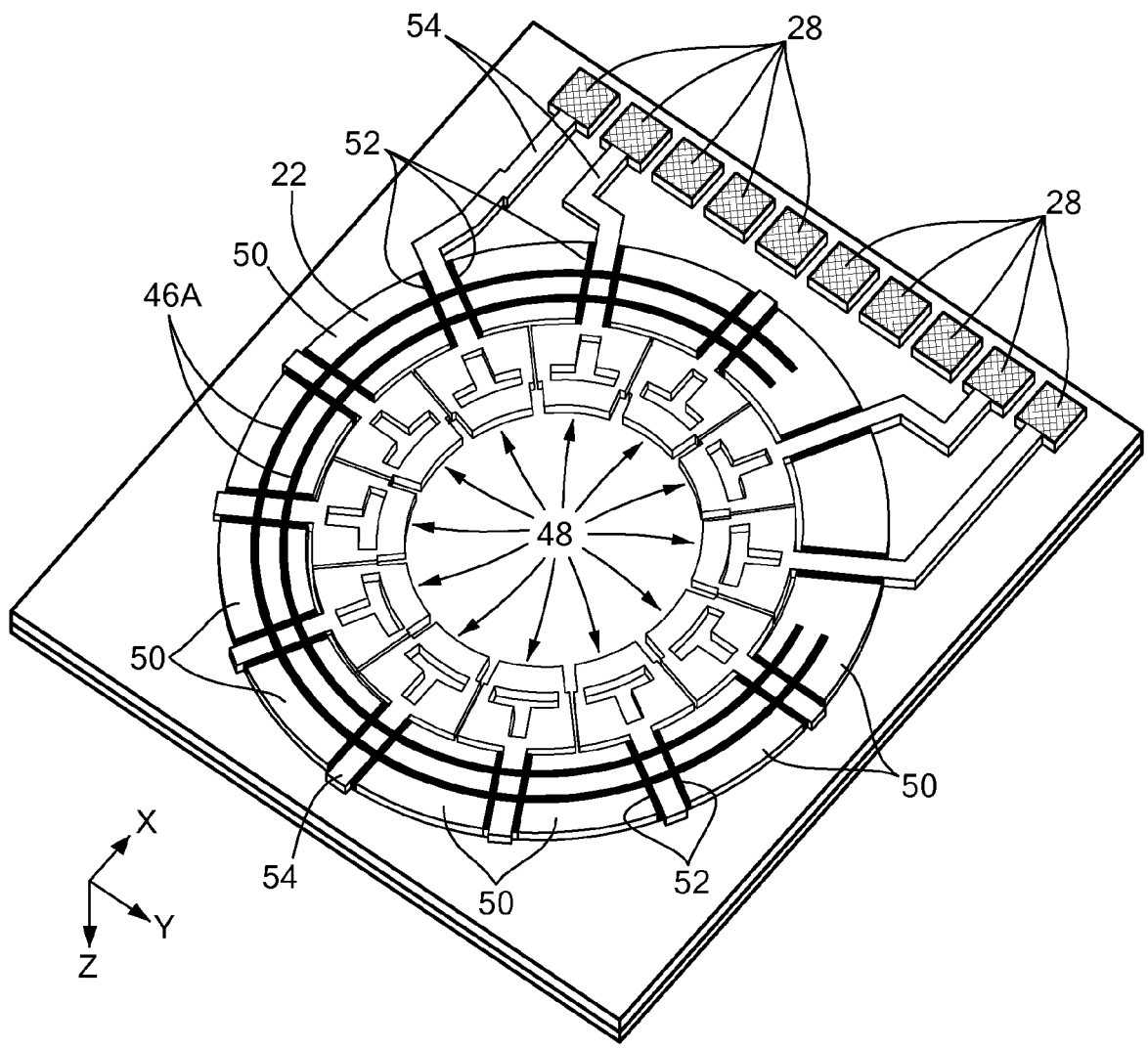
FIG. 4 schematically shows a top perspective view of a bottom electrode in the gyroscope of FIG. 2.
Figure 5:
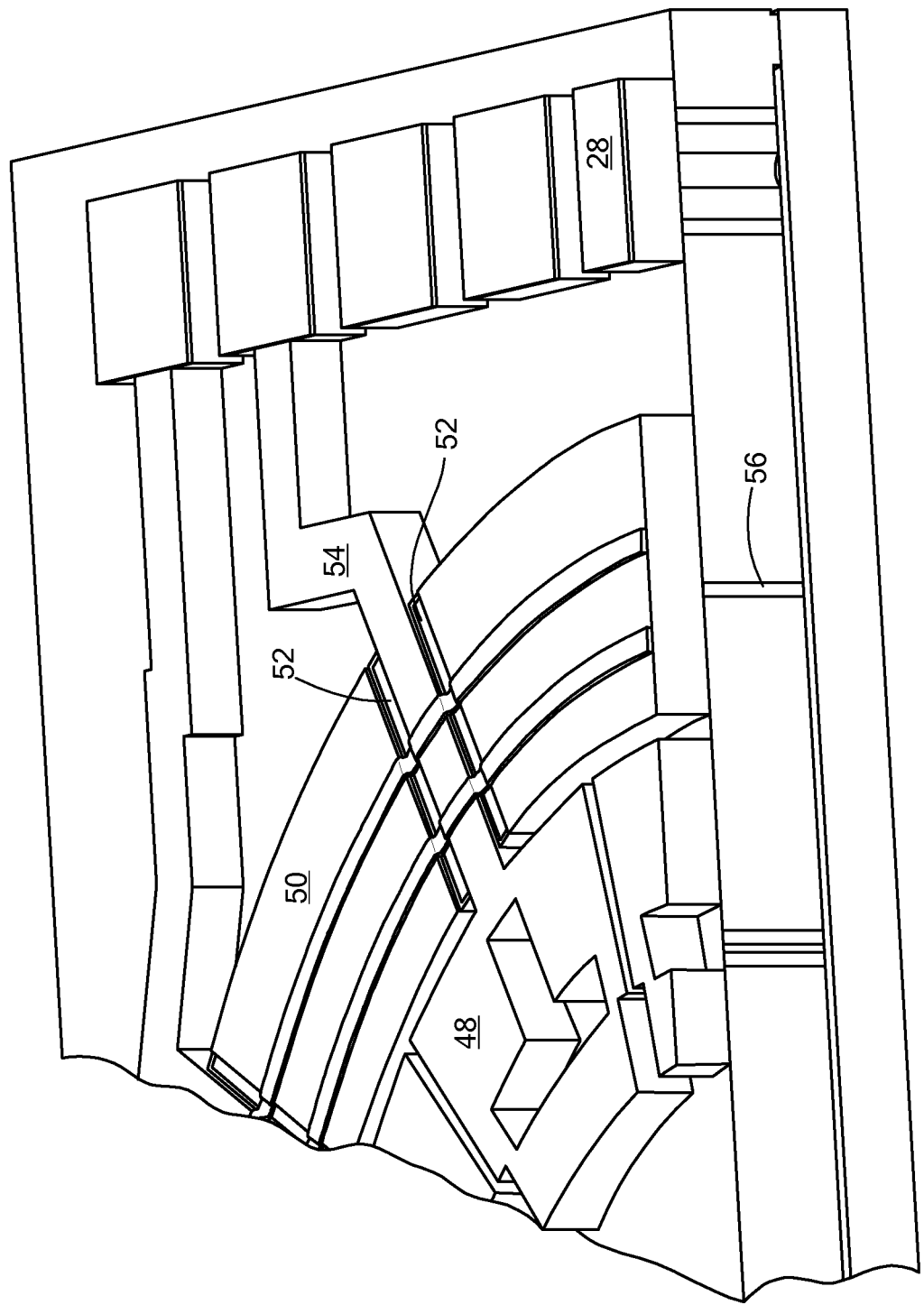
FIG. 5 schematically shows a perspective close-up view of a portion of the gyroscope shown in FIG. 4 with a partial cut-away portion.

FIGS. 4-5 schematically show additional details of the bottom electrode/bottom layer 36 of the gyroscope 12. Specifically, FIG. 4 schematically shows a top perspective view of the bottom electrode/bottom layer 36 of the gyroscope 12 shown in FIGS. 2 and 3, while FIG. 5 schematically shows a close up, partial cross-sectional view of the gyroscope from the perspective of FIG. 4.

As shown in FIG. 4, the bottom electrode 22 may comprise twelve separate electrodes (referred to as "actuating portions 48") that cooperate to actuate the disk 18 in a flexure mode. Specifically, the bottom electrode 22 shown in FIG. 4 has two sets of six electrodes that each provide opposite force to the disk 18—one set pushes while the other pulls. Both sets alternate (i.e., they are about 180 degrees out of phase) according to the actuation frequency. A first pad controls one set of electrodes, while a second pad controls the second set of electrodes. A pair of generally circular, concentric metallic traces 46A connects the bottom electrodes 22 in the desired manner. More particularly, each of the two traces 46A electrically connects every other electrode to form the two sets.

In accordance with illustrative embodiments of the invention, the bottom electrode 22 is separated into a plurality of different portions that together form a single, mechanically connected (substantially integral) unit. These portions, however, fall into two sets of portions; namely, actuating portions 48 for actuating the disk, and stabilizing, grounded portions ("stabilizing portions 50") for stabilizing the entire bottom electrode layer 22/36.

To those ends, as shown in greater detail in FIG. 5, the bottom electrode 22 has a plurality of isolation trenches 52 that separate the actuating portions 48 from the stabilizing portions 50. Specifically, the as discussed in greater detail below in FIG. 7, the isolation trenches 52 have nitride lined walls and polysilicon between the nitride lined walls for mechanical integrity and planarization. Accordingly, these nitride lined, polysilicon filled trenches 52 provide the requisite electrical isolation between the actuating portions 48 and the stabilizing portions 50.

It should be noted, however, that those skilled in the art can use other materials to perform the same electrical isolation and structural function. For example, the trenches 52 can be lined with another dielectric material and filled/planarized by an oxide or multi-crystalline silicon or germanium. Accordingly, discussion of nitride and polysilicon is not intended to limit various embodiments the invention.

Each isolation trench 52 effectively forms a lead 54 that electrically connects its local actuation portion 48 with a bond pad 28. Specifically, as best shown in FIG. 4 and noted above, one pad 28 controls a first set of actuation portions 48 while another pad 28 controls a second set of actuation portions 48.

In a corresponding manner, the stabilizing portions 50 all may be at a different potential (e.g., at a ground potential) than those of the actuation portions 48. To that end, illustrative embodiments form one or more vias 56 through the device wafer and into the stabilizing portions. Among other things, the vias 56 include doped polysilicon. Accordingly, the vias 56 both electrically contact the stabilizing portions 50 and mechanically, directly connect/anchor the stabilizing portions 50 to the device layer/wafer 38. Alternatively, or in addition, a layer of oxide between the stabilizing portions 50 and device wafer 38 may provide similar mechanical stability. In either case, the stabilizing portions 50 may be considered to be directly coupled with structure in the device layer plane (e.g., the interior face of the device layer 38).

Figure 6:
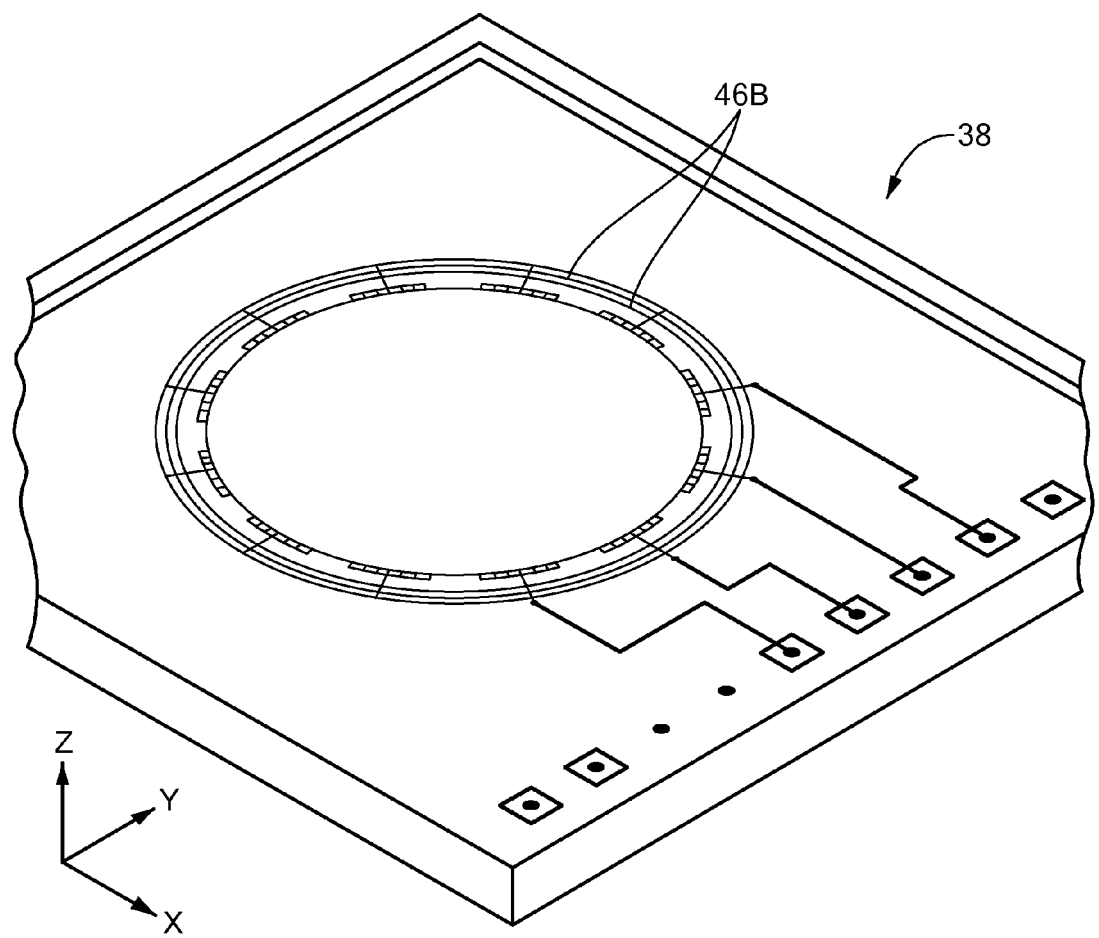
FIG. 6 schematically shows a top perspective view of the device layer, including the resonating/vibrating disk, in accordance with illustrative embodiments of the invention.

FIG. 6 shows the electrical connections between the side electrodes 26 and the pads 28, as well as the top face of the disk 18. Unlike the schematic diagram of FIG. 2, this embodiment shows twelve side electrodes 26. In a manner similar to the bottom electrode, three concentric, circular conductive traces 46B electrically connect various combinations of the side electrodes 26 to the pads 28.

Figure 7:
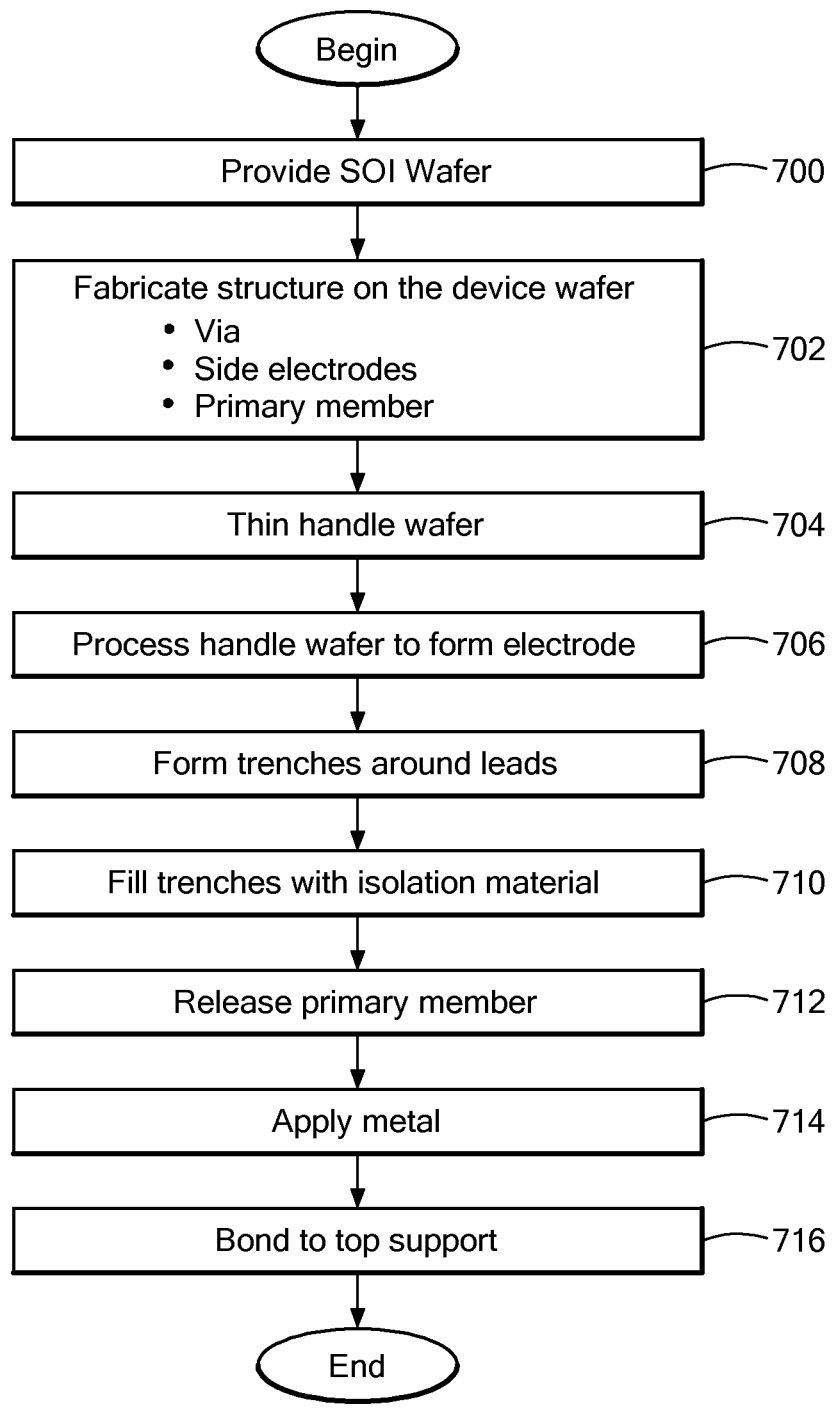
FIG. 7 shows a process of forming a bulk acoustic wave inertial sensor in accordance with illustrative embodiments of the invention.

Any number of different processes may form the gyroscope 12. For example, much of the process discussed in parent patent application Ser. No. 12/940,354, noted and incorporated above, should suffice. As a second example, FIG. 7 shows a process of forming a gyroscope in accordance with illustrative embodiments invention. This process forms the gyroscope 12 primarily from a SOI wafer. It nevertheless should be noted that other processes may use other types of wafers, such as bulk silicon wafers. Accordingly, discussion of SOI wafers is by example only.

It should be noted that for simplicity, this described process is a significantly simplified version of an actual process used to fabricate the gyroscope 12 discussed above. Accordingly, those skilled in the art would understand that the process may have additional steps and details not explicitly shown in FIG. 7. Moreover, some of the steps may be performed in a different order than that shown, or at substantially the same time. Those skilled in the art should be capable of modifying the process to suit their particular requirements.

The process begins at step 700, by providing an SOI wafer. The next three steps, step 702, 704 and 706, which, as noted above, may be performed either at the same time or in a different order, form the microstructure making up the gyroscope 12. Specifically, step 702 forms the disk 18 (also referred to as the "primary member") and side electrodes 26 primarily on/from the top layer 38 of the SOI wafer, while step 706 forms the bottom electrode 22 from the handle wafer (a/k/a the top layer 38 of the SOI wafer). Illustrative embodiments form the bottom electrode 22 to be self-aligning and thus, use a single mask. Moreover, step 704 thins the handle wafer. Micromachining processes also form additional microstructure.

In addition, step 702 also forms the vias 56 that connect the stabilizing portions 50 of the electrode layer 22/36 to the device wafer 38. To that end, among other ways, the process may etch a square or round "donut" shaped trench through the device wafer 38 using deep reactive ion etching techniques. Next, the process may deposit polysilicon in the trench, and planarize the polysilicon with an etch back step. Accordingly, the trench and polysilicon forms a mechanically continuous boundary structure with a central region filled with silicon.

The process then may etch a square or round channel/trench through the central region of the boundary structure in the device layer, again using deep reactive ion etching techniques. Next, the process punches through the buried oxide layer of the SOI wafer and etches into the stabilizing portions 50 of the bottom electrode layer. Finally, the process may fill this new trench with polysilicon, which, like the boundary structure, also may be planarized with an etch back step.

After completing step 702, 704, and 706, or while completing those steps, the process continues to step 708, which forms trenches 52 around what will become the bottom electrode leads 54. Again, deep reactive ion etching techniques may form these trenches 54. Step 710 then may fill the trenches 54; first with an isolation material, such as nitride liner (i.e., a dielectric), and then with polysilicon to provide the structural connection. Again, conventional etch back techniques may planarize the polysilicon. Accordingly, step 708 and 710 effectively form the two separate portions/types of the electrode layer.

Step 712 then releases the primary member/disk 18, thus removing the oxide between the actuating portions 48 of the electrode layer 22/36 and the disk 18, and much of the rest of the (buried) oxide layer of the SOI wafer. For example, the process may release the disk 18 by immersing the structure in a bath of hydrofluoric acid. This step also can remove some of the oxide between the stabilizing portions 50 of the electrode layer 22/36 and the device layer 38. Embodiments using vias 56, however, should provide structural integrity to anchor the stabilizing portions 50 in a sufficient manner. Alternative embodiments may use a timed etch to maintain some of the oxide layer between the stabilizing portions 50 and the device layer 38.

Next, step 714 deposits the metal to form, among other things, the concentric metallic traces 46A and top surface of the pads 28 on the electrode layer 22/36. Another deposited metal portion formed by this step includes the traces 46B. Rather than release (step 712) and then apply metal (step 714), other embodiments apply metal before releasing (i.e., step 714 and then step 712).

Finally, the process concludes at step 716 by bonding the top and bottom substrates 40 and 30 to the microstructure formed by the previous steps. Specifically, the top substrate 40 may be formed from a single crystal silicon wafer having an etched cavity that fits over the processed top layer 38 of the (former) SOI wafer. This etched cavity forms the above noted annular sealing region 44 of the top substrate 40, which forms a seal with the bottom layer 36 of the disk/lower electrode apparatus. To that end, conventional processes bond the annual seal region 44 to the bottom layer 36 of the SOI wafer. For example, a glass frit 32 may provide a hermetic or non-hermetic seal at that point.

In addition, the interior of the cavity bonds directly with the support portion 42 extending from the disk 18. A glass frit (not shown here) also may make this connection. Alternatively, some of the embodiments that form the support portions directly from the top substrate 40 (e.g., forming the top support portions 42 as pedestals with a timed etch) may simply make a direct silicon-to-silicon bond with the node(s) 24 on the top surface of the disk 18.

The process may bond the bottom substrate 30 to the bottom layer 36 of the processed SOI wafer in a similar manner. For example, a glass frit 32 may couple the bottom substrate 30 about the edges of the bottom layer 36 to provide a hermetic or non-hermetic seal. In addition, a silicon-to-silicon bond, or other bond as discussed above with the top substrate 40, also may secure the bottom substrate 30 to the node(s) 24 and bottom support portions 34 on the bottom surface of the disk 18.

The BAW gyroscope therefore provides a bottom electrode 22 with two electrically isolated but generally integrally connected portions—the actuating portions 48 and grounded stabilizing portions 50. Alternatively, some embodiments do not ground the stabilizing portions 50. Vias 56 connecting to the stabilizing portions 50 support the entire electrode layer 22, and electrically permit control of the potential of the stabilizing portions 50.

It should be noted that some embodiments may actuate and detect movement of the disk 18 in other modes than those discussed. For example, some embodiments may actuate in a bulk mode. Accordingly, discussion of the specific modes is for illustrative purposes only.

Although the above discussion discloses various exemplary embodiments of the invention, it should be apparent that those skilled in the art can make various modifications that will achieve some of the advantages of the invention without departing from the true scope of the invention.

What is claimed is:

1. A bulk acoustic wave gyroscope comprising:
a primary member in a member plane; and
an electrode layer in an electrode plane spaced from the member plane,
the electrode layer having a first portion and a second portion, the first portion being electrically isolated from the second portion, the first portion being mechanically coupled with the second portion, the second portion being separate from the primary member and stabilizing the electrode layer,
the first portion of the electrode layer facing the primary member,
the second portion of the electrode layer being directly coupled with a structure in the member plane.

2. The gyroscope as defined by claim 1 further comprising a conductive path extending from the member plane and into the second portion of the electrode layer.

3. The gyroscope as defined by claim 2 wherein the conductive path comprises a via.

4. The gyroscope as defined by claim 1 wherein an oxide directly couples the second portion of the electrode layer with the structure in the member plane.

5. The gyroscope as defined by claim 1 wherein the second portion of the electrode layer is grounded.

6. The gyroscope as defined by claim 1 further comprising a trench separating the first portion of the electrode layer from the second portion of the electrode layer, the trench being at least partly filled with a dielectric material.

7. The gyroscope as defined by claim 1 further comprising a side electrode in the member plane, the side electrode being radially spaced from the primary member.

8. The gyroscope as defined by claim 1 wherein the primary member and the electrode layer are formed at least in part from a silicon-on-insulator wafer.

9. The gyroscope as defined by claim 1 wherein the primary member forms a disk that resonates in a flexure mode in response to receipt of an electrostatic signal from the first portion of the electrode layer.

10. A bulk acoustic wave gyroscope comprising:
a resonating member in a member plane; and
a bottom electrode layer in an electrode plane, the member and electrode planes being spaced apart,
the resonating member being formed at least in part from a first layer of a silicon on insulator wafer, the bottom electrode layer at least in part being formed from a second layer of the silicon on insulator wafer,
the bottom electrode layer having a first portion and a second portion, the first portion being electrically isolated from the second portion, the first portion facing the resonating member and configured to electrostatically actuate the resonating member when subjected to a voltage, the second portion being separate from the resonating member and stabilizing the bottom electrode layer,
the first portion of the electrode layer being mechanically secured to the second portion of the electrode layer,
the second portion of the electrode layer being anchored to a structure in the member plane.

11. The gyroscope as defined by claim 10 further comprising a via anchoring the second portion of the electrode layer to a structure in the electrode plane.

12. The gyroscope as defined by claim 10 wherein an oxide directly couples the second portion of the electrode layer with the structure in the member plane.

13. The gyroscope as defined by claim 10 further comprising a trench separating the first portion of the electrode layer from the second portion of the electrode layer, the trench being at least partly filled with a dielectric material.

14. The gyroscope as defined by claim 10 further comprising a side electrode in the member plane, the side electrode being radially spaced from the resonating member.

15. The gyroscope as defined by claim 10 wherein the second portion of the electrode layer is configured to be grounded when a voltage is applied to the first portion of the electrode layer.

* * * * *